United States Patent
Clara et al.

(10) Patent No.: US 7,532,082 B2
(45) Date of Patent: May 12, 2009

(54) SYNCHRONIZATION CIRCUIT FOR SYNCHRONIZING PWM MODULATORS

(75) Inventors: Martin Clara, Villach (AT); Thomas Poetscher, Villach (AT); Sergio Walter, Villach (AT); Andreas Wiesbauer, Poertschach (AT)

(73) Assignee: Infineon Technologies AG, Munich (DE)

( * ) Notice: Subject to any disclaimer, the term of this patent is extended or adjusted under 35 U.S.C. 154(b) by 257 days.

(21) Appl. No.: 11/593,235

(22) Filed: Nov. 6, 2006

(65) Prior Publication Data

US 2007/0104266 A1 May 10, 2007

(30) Foreign Application Priority Data

Nov. 4, 2005 (DE) .................. 10 2005 052 702

(51) Int. Cl.
*H03K 7/08* (2006.01)
(52) U.S. Cl. .................. 332/109; 340/825.19; 375/238
(58) Field of Classification Search ................. 332/109; 375/238; 340/825.26
See application file for complete search history.

(56) References Cited

U.S. PATENT DOCUMENTS

2007/0286273 A1* 12/2007 Clara et al. .................. 375/238

FOREIGN PATENT DOCUMENTS

| DE | 20380325 | 7/2005 |
| JP | EP 1458085 | 3/2004 |
| WO | WO 2005/029707 | 3/2005 |

OTHER PUBLICATIONS

German Office Action dated Aug. 22, 2006.

* cited by examiner

*Primary Examiner*—Arnold Kinkead
(74) *Attorney, Agent, or Firm*—Jenkins, Wilson, Taylor & Hunt, P.A.

(57) ABSTRACT

A synchronization circuit for synchronizing at least two self-oscillating PWM modulators, each outputting a respective pulse-width-modulated output signal comprising signal pulses with signal pulse centers, shifts the timings of the signal pulses relative to one another such that their signal pulse centers are in sync.

10 Claims, 13 Drawing Sheets

FIG 1A
Prior art
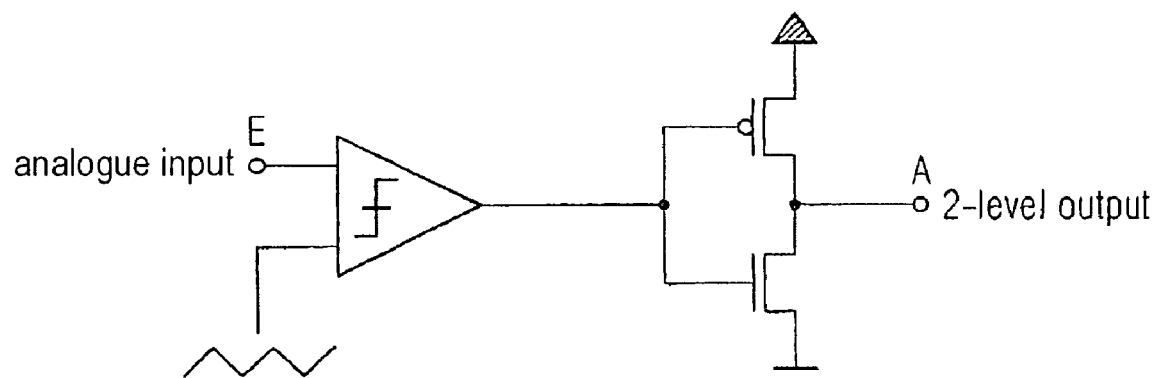
FIG 1B
Prior art
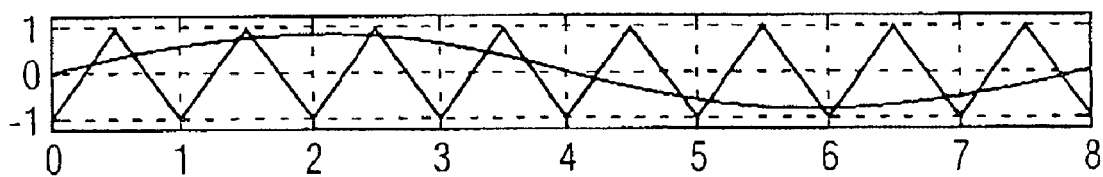
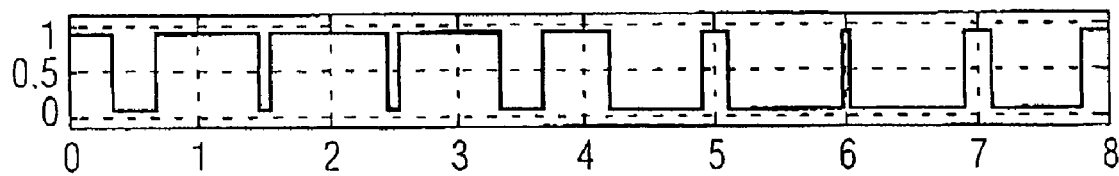

3-level output 3-level output

SYNCHRONIZATION CIRCUIT FOR SYNCHRONIZING PWM MODULATORS

BACKGROUND OF THE INVENTION

The invention relates to a synchronization circuit for synchronizing self-oscillating PWM modulators, particularly for a driver circuit.

FIG. 1A shows a conventional circuit arrangement for producing a pulse-width-modulation signal based on the prior art. The PWM modulation signal is obtained using a comparator by comparing the signal to be modulated with a sawtooth or triangular signal. FIG. 1B shows the production of a pulse-width-modulated signal through comparison of an analogue input signal with a triangular reference signal. Pulse-width-modulated signals can be amplified particularly efficiently. As FIG. 1A shows, the PWM signal produced is amplified by a power stage and is output at an output A.

As FIG. 2 reveals the amplified pulse-width-modulated signal is then filtered by an out-of-band filter in order to obtain the original analogue input signal and is supplied to an electrodynamic transducer or a loudspeaker, for example.

FIG. 3B shows the signal spectrum for a pulse-width-modulated signal which is produced using a pulse width modulator as shown in FIG. 3A. The pulse width modulator shown in FIG. 3A is the pulse width modulator already described in FIG. 1A, which provides a two-level amplified pulse-width-modulated output signal. As FIG. 3B reveals, the pulse-width-modulated signal produced has many spectral components which are situated around the switching frequency of the pulse width modulator. In order to meet the PSD masking demands of a signaling transmission standard, for example an ADSL standard, the downstream OOB filter A therefore needs to have a relatively steep filter curve in order to reconstruct the analogue signal in the PWM modulator shown in FIG. 3A, as shown in FIG. 3B.

Pulse width modulators of differential design have therefore been proposed, as are shown schematically in FIG. 3C. FIG. 3D shows the associated signal spectrum normalized to the switching frequency of the PWM modulator. As FIG. 3D reveals, the signal spectrum has no signal components in the range of the switching frequency. The downstream OOB filter B can therefore have a less steep filter edge, so that the circuit complexity for implementing the OOB filter is prevented. In practice, this results in the OOB filter's filter order being able to be reduced and the number of LC components being reduced.

FIGS. 4A, 4B, 4C are used to illustrate the problem on which the invention is based. A driver circuit of differential design, as shown in FIG. 4A, with two PWM modulators has a perturbing spectral increase, for example in the case of an ADSL signal in the range of a switching frequency of 10 MHz, if the two PWM modulators are not totally in sync with one another. If the two PWM modulators in the signal driver of differential design are not in sync, these spectral noise components can be filtered out only using a technically complex filter, i.e. using a high-order OOB filter. This increases the circuit complexity for the driver circuit.

To synchronize two self-oscillating PWM modulators, a paper from the University of Leuven, SOPA: "A High-Efficiency Line Driver in 0.35 µm CMOS using a Self-Oscillating Power Amplifier", Proceedings of ISSCC 2001, has proposed the circuit arrangement based on the prior art which is shown in FIG. 5. The driver circuit of differential design which is shown in FIG. 5 contains two PWM modulators arranged in parallel which are supplied with an analogue input signal $V_{IN}$. The PWM modulators are self-oscillating and have a comparator with a digital buffer which is fed back via a feedback filter to the comparator. The two PWM modulators are of totally analogue design. The feedback filter is designed such that the feedback loop is unstable or oscillates. The outputs of the two PWM modulators are coupled to one another via a capacitor $C_{TANK}$ and via the primary coil of a transformer. The coupling via the capacitor $C_{TANK}$ is strong particularly at higher frequencies, since the impedance of the capacitor moves towards zero at high frequencies. The output-side coupling for synchronization is made only indirectly in the case of the circuit arrangement shown in FIG. 5 and, in particular, is not sufficient to reject spectral components in the frequency range of the switching frequency of the PWM modulators to an adequate degree.

FIG. 6 shows another circuit arrangement based on the prior art which has been proposed in order to synchronize two PWM modulators to one another. The circuit arrangement shown in FIG. 6 is described in published international application for patent No. 2003055060 A1. The two PWM modulators 21A, B respectively have a signal input for applying an analogue input signal, with the PWM modulator A receiving the analogue input signal $V_{IN}$ inverted by an inverter and the PWM modulator B receiving the uninverted analogue input signal $V_{in}$. The two PWM modulators A, B are self-oscillating and have an input signal filter B1, B2 which filters a difference signal between the applied input signal and a feedback signal. The synchronization circuit is provided between the output of the input signal filter and the input of a comparator, which compares the difference signal with a reference voltage for producing a comparator output signal. The comparator output signal is amplified by a power stage and is fed back to the input signal filter via an analogue passive feedback filter A. As FIG. 6 reveals, synchronization in the case of the circuit arrangement based on the prior art takes place upstream of the comparator in the forward signal path of the PWM modulator, so that the proportion of nonlinearities in the PWM modulation increases as the coupling or synchronization of the PWM modulators increases.

In the case of the conventional circuit arrangement shown in FIG. 6, mismatches or synchronization errors can be compensated for up to approximately 0.1%. In the case of a greater error or in the case of a greater mismatch between the two PWM modulators, synchronization is not possible.

BRIEF DESCRIPTION OF THE INVENTION

In one aspect of the invention, a synchronization circuit for synchronizing at least two self-oscillating PWM modulators which output a respective pulse-width-modulated output signal shifts the timings of the signal pulses in the pulse-width-modulated output signals relative to one another such that their signal pulse centers are in sync.

One idea on which the invention is based is, rather than performing synchronization by means of cross-coupling, to reduce the error between the switching signals of the PWM modulation by setting the self-oscillation frequencies of the pulse width modulators to an identical value.

In this case, the PWM modulators are preferably modified such that they have an additional control input which is used to set the oscillation frequency.

In one embodiment of the inventive synchronization circuit, the self-oscillating PWM modulators respectively comprise a signal input for receiving an analogue input signal, an input signal filter which filters a difference signal between the analogue input signal and a feedback signal, a comparator which compares the filtered difference signal with a reference voltage in order to produce a comparator output signal, a delay circuit which delays the timing of the comparator output signal on the basis of a synchronization control signal, a power stage which amplifies the delayed comparator output signal, a feedback filter which filters the amplified comparator output signal and outputs it as a feedback signal to the input signal filter, and a signal output which outputs the amplified comparator output signal as a pulse-width-modulated output signal.

In another embodiment of the inventive synchronization circuit, the synchronizing circuit comprises:

a first input for receiving a first pulse-width-modulated output signal from a first self-oscillating PWM modulator, a second input for receiving a second pulse-width-modulated output signal from a second self-oscillating PWM modulator, a first output for outputting a first synchronization control signal to a delay circuit contained in the first self-oscillating PWM modulator;

and a second output for outputting a second synchronization control signal to a delay circuit contained in the second self-oscillating PWM modulator.

In a further embodiment of the inventive synchronization circuit, the synchronizing circuit comprises:

a first phase detector for ascertaining a phase difference between rising signal edges in the two pulse-width-modulated output signals, a second phase detector for ascertaining a negative phase difference between falling signal edges in the two pulse-width-modulated output signals, an adder for adding the phase differences ascertained by the phase detectors; and at least one integrator which integrates the added phase differences in order to produce synchronization control signals for actuating the delay circuits contained in the two self-oscillating PWM modulators.

The synchronization circuit may shift the timings of the two pulse-width-modulated output signals relative to one another such that a difference signal between the two pulse-width-modulated output signals has no frequency components in a frequency range of a switching frequency of the self-oscillating PWM modulators.

The first self-oscillating PWM modulator may modulate an analogue input signal and the second PWM modulator may modulate its inverse analogue input signal.

The analogue input signal may be an xDSL signal.

The analogue input signal may be formed by an audio signal.

The two pulse-width-modulated output signals whose timings have been shifted relative to one another may be filtered by a downstream out-of-band filter.

The signal filtered by the out-of-band filter may be output to a two-wire telephone line.

In another aspect of the invention, a method for synchronizing at least two self-oscillating pulse-width-modulated signals, the timings of the signal pulses in the pulse-width-modulated signals are shifted relative to one another such that the synchronization pulse centers of the signal pulses are in sync with one another.

The inventive synchronization circuit may preferably be used in driver circuits which drive signals for a telephone line.

The inventive synchronization circuit is suitable particularly for driver circuits for driving xDSL signals via a two-wire telephone line.

Such a driver circuit for a telephone line may comprise:

a first PWM modulator for pulse-width modulation of an analogue input signal, a second PWM modulator for pulse-width modulation of its inverse analogue input signal, a synchronization circuit based on the invention for synchronizing the two pulse-width-modulated signals which are output by the PWM modulators, where the synchronization circuit shifts the timings of the signal pulses in the pulse-width-modulated signals relative to one another such that their signal pulse centers are in sync with one another; and an out-of-band filter which filters the two pulse-width-modulated signals synchronized by the inventive synchronization circuit and outputs them to the telephone line.

The text below describes preferred embodiments of the inventive synchronization circuit and of the inventive method for synchronizing at least two pulse-width-modulated signals with reference to the appended figures in order to explain features which are fundamental to the invention.

BRIEF DESCRIPTION OF THE SEVERAL VIEWS OF THE DRAWINGS

FIGS. 1A, 1B, as discussed above, show the production of a conventional two-level PWM signal.

DETAILED DESCRIPTION OF THE INVENTION

Figure 2:
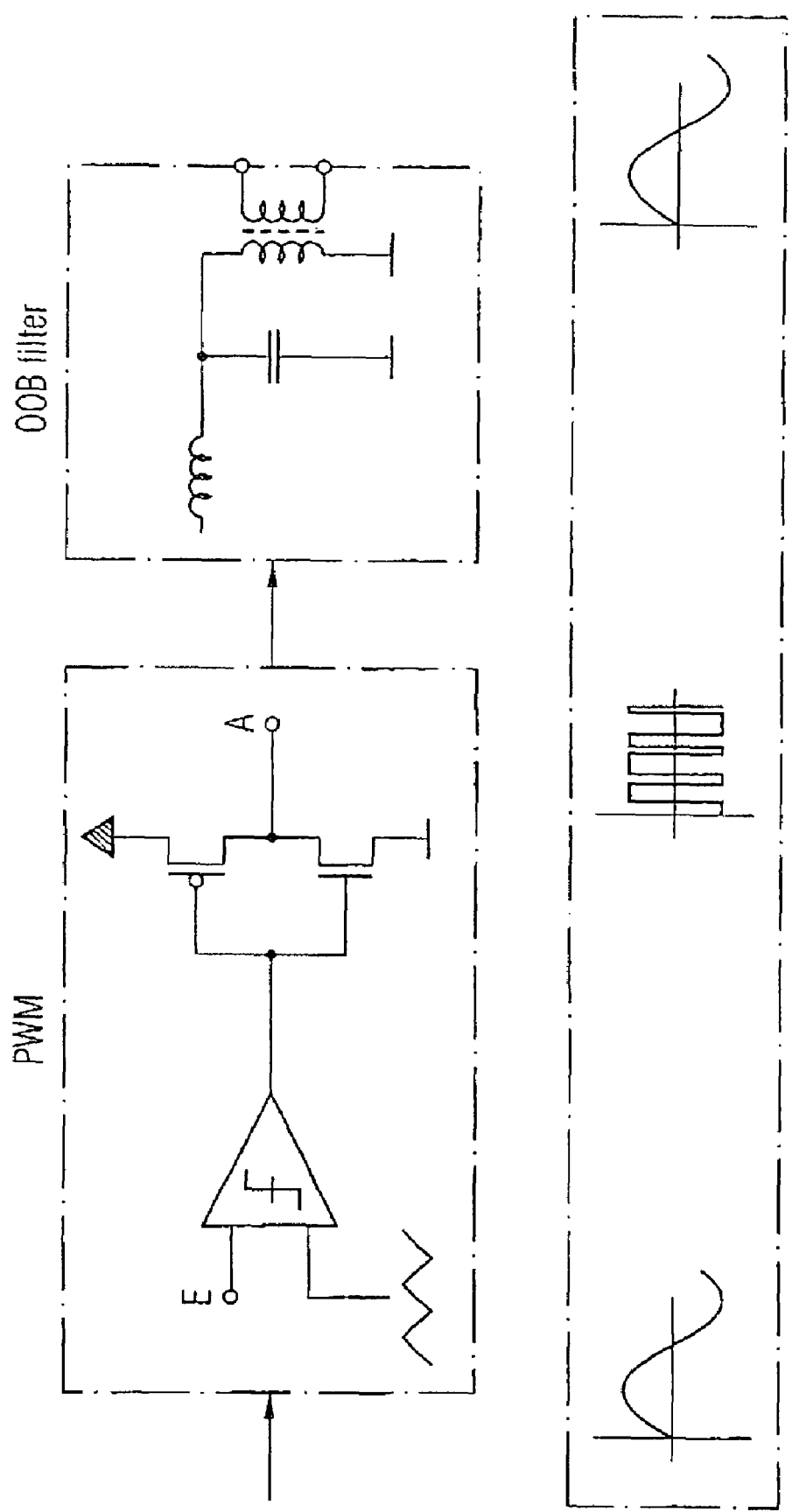
FIG. 2, as discussed above, is a conventional circuit arrangement with an out-of-band filter for reconstructing a pulse-width-modulated analogue input signal.
Figure 3A:
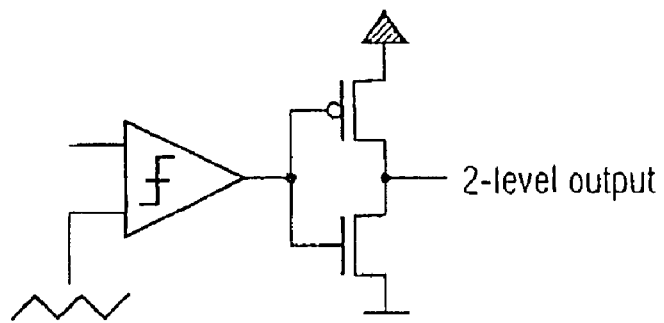
FIGS. 3A, 3B, 3C, 3D, as discussed above, are signal spectra to explain the problems on which the invention is based.
Figure 3B:
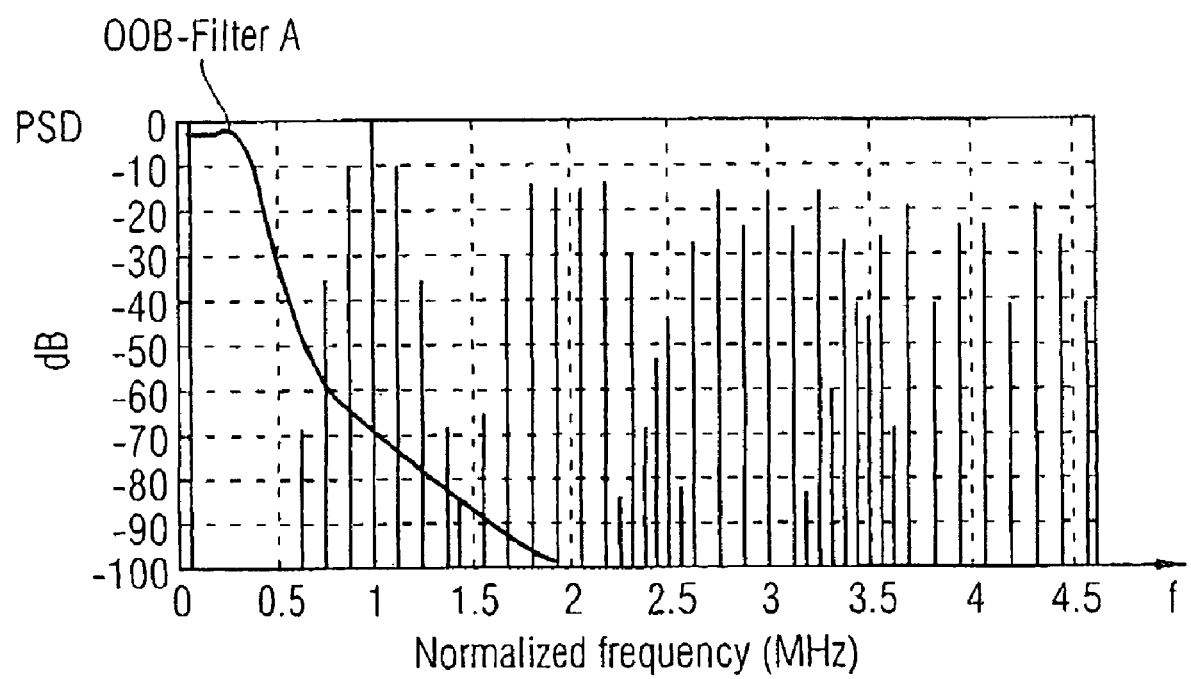
Figure 3C:
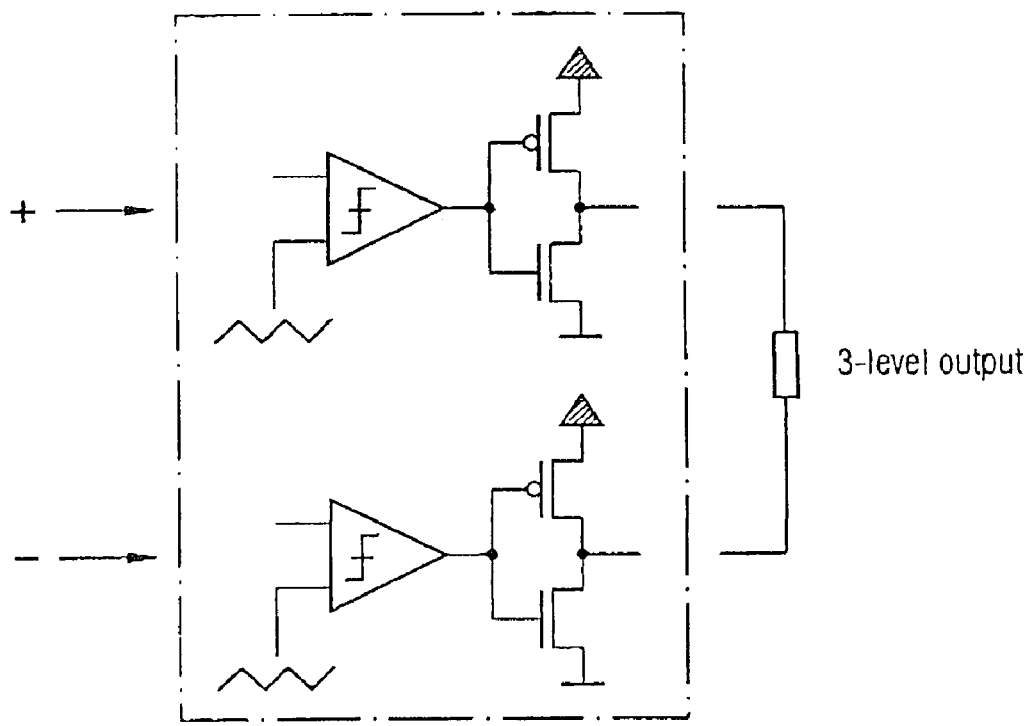
Figure 3D:
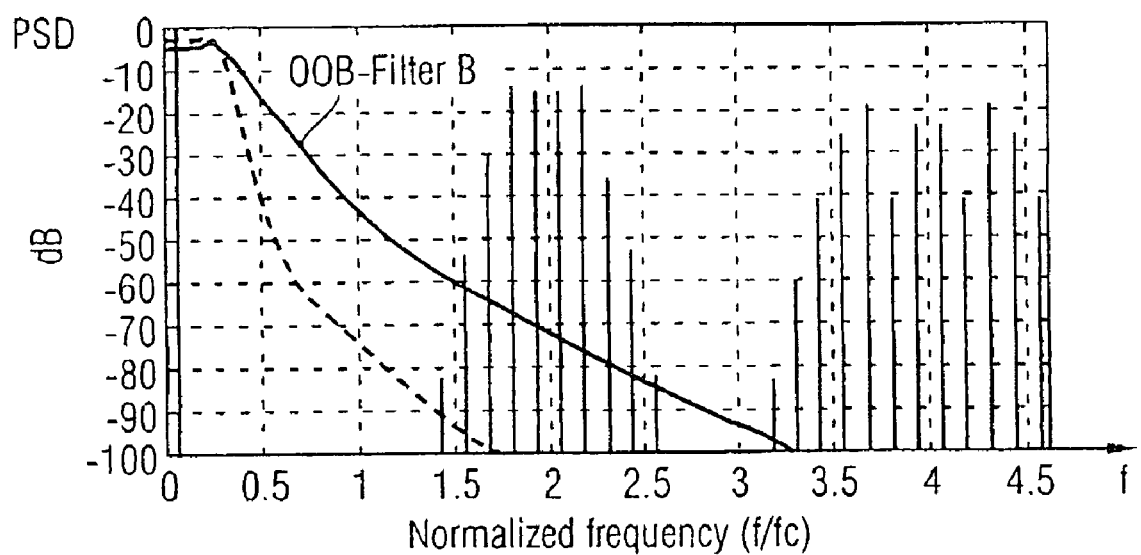
Figure 4A:
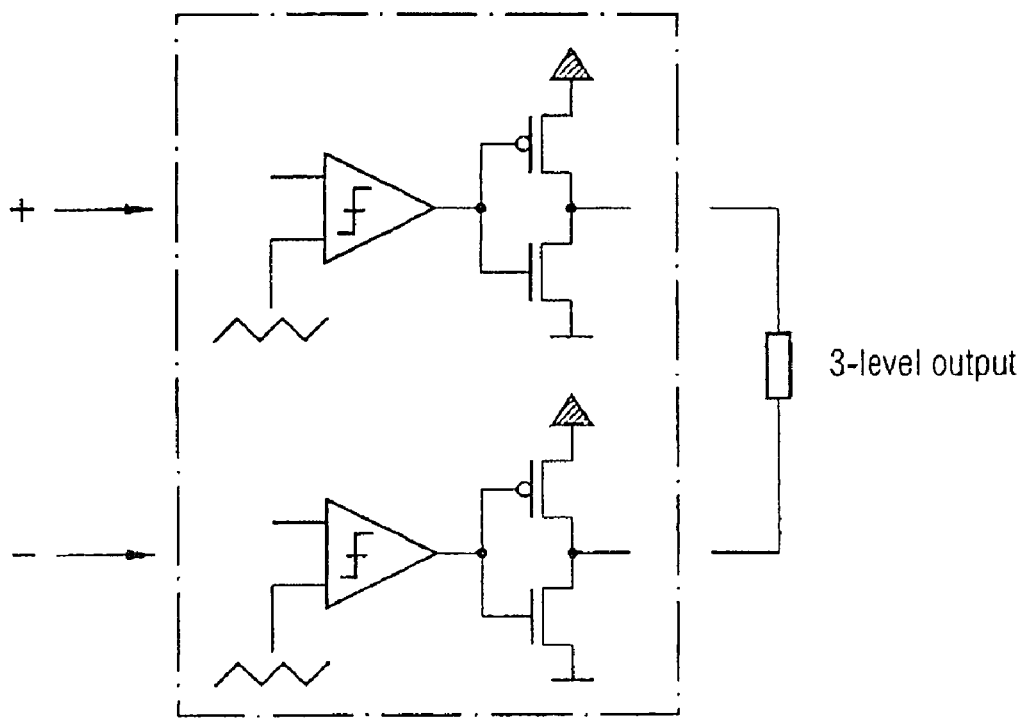
FIGS. 4A, 4B, 4C, as discussed above, are a three-level PWM driver circuit with associated signal spectra to explain the problems on which the invention is based.
Figure 4B:
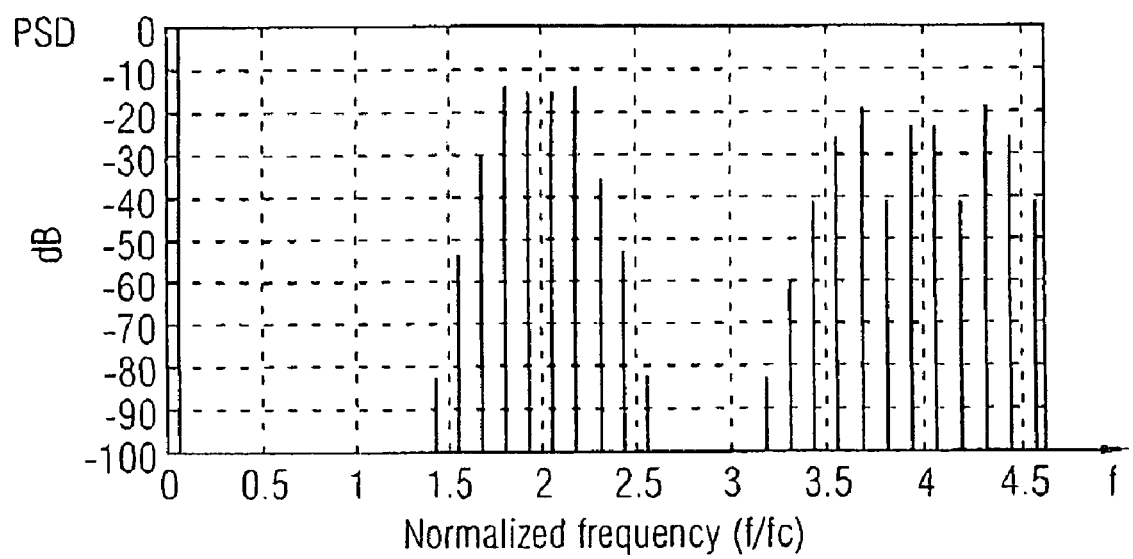
Figure 4C:
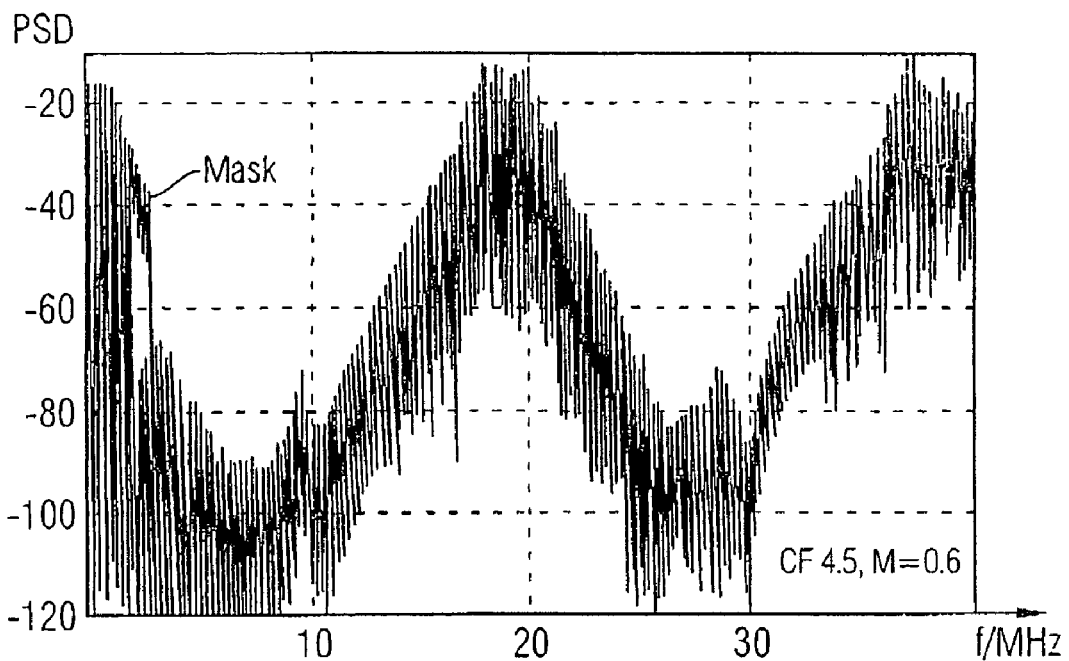
Figure 5:
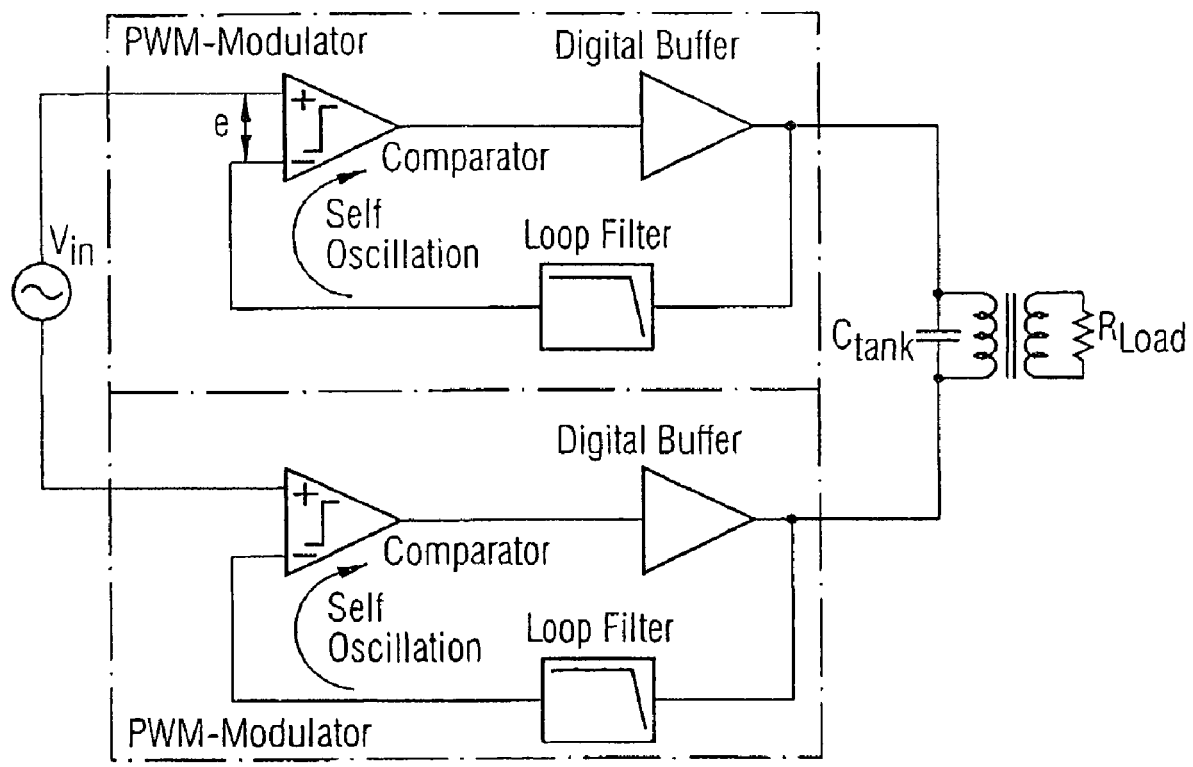
FIG. 5, as discussed above, is a conventional first synchronization circuit for synchronizing PWM modulators.
Figure 6:
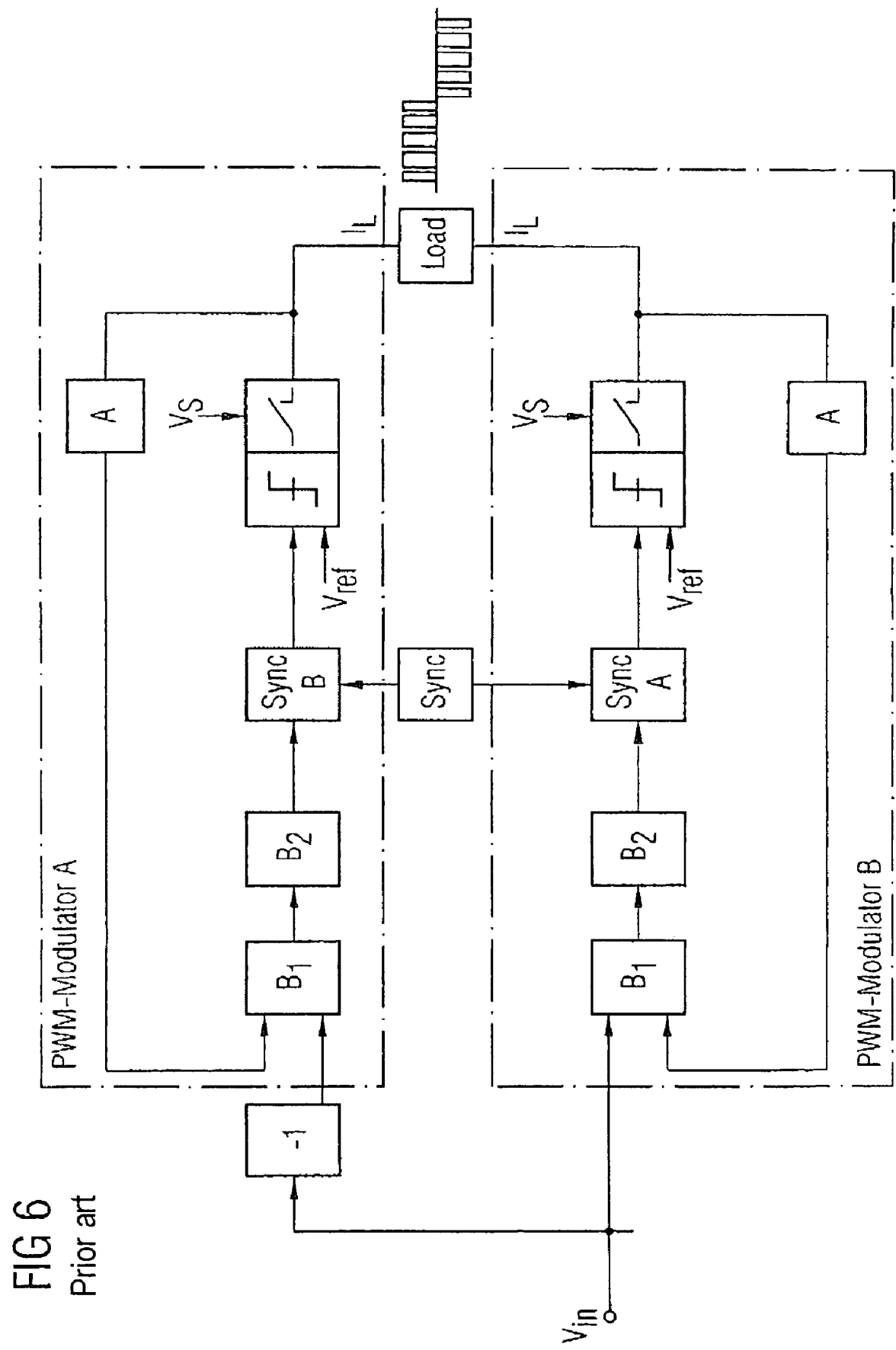
FIG. 6, as discussed above, is a conventional second synchronization circuit.
Figure 7:
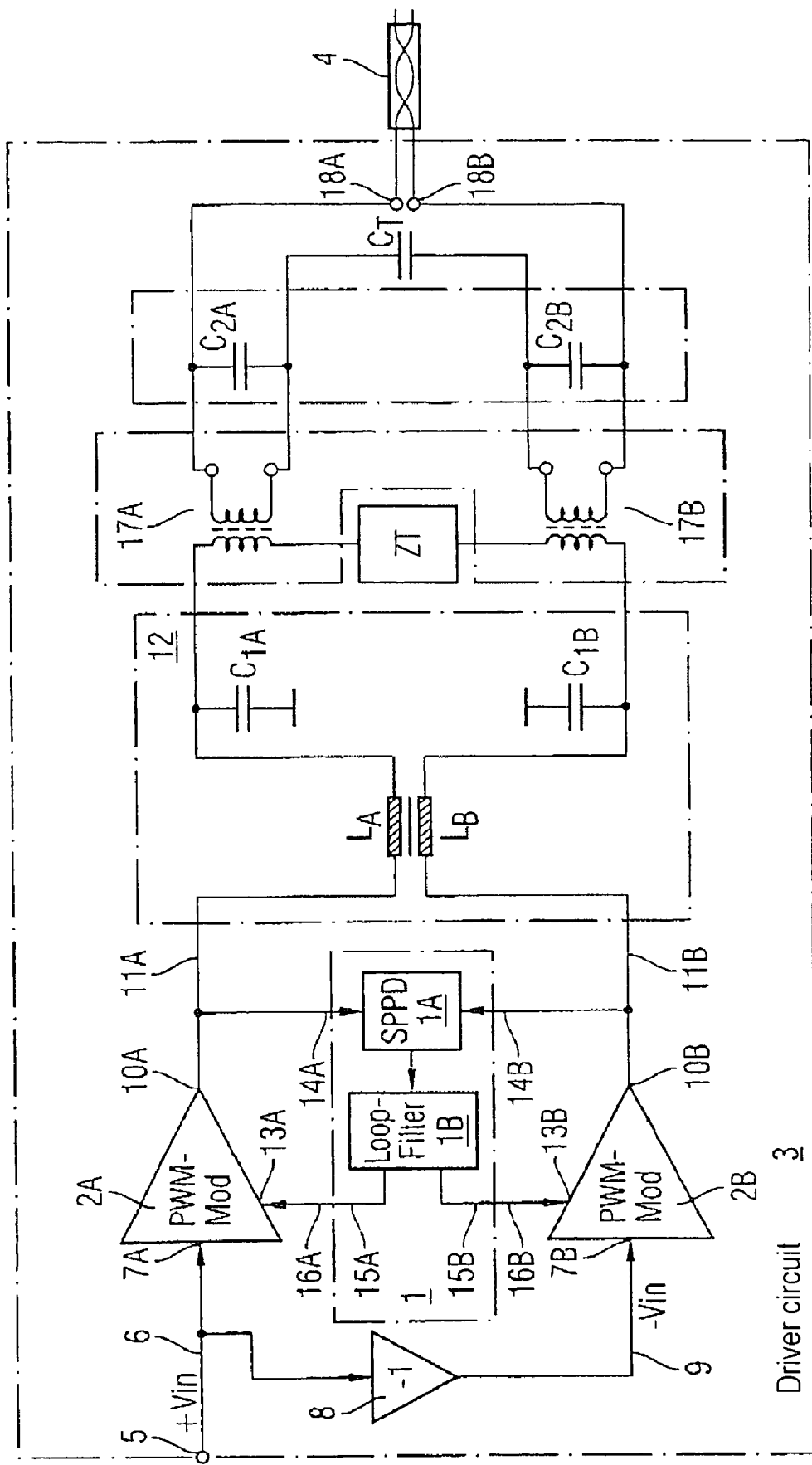
FIG. 7 is an exemplary embodiment of a driver circuit which comprises a synchronization circuit based on the invention.

As FIG. 7 reveals, the inventive synchronization circuit 1 can be used particularly for synchronizing self-oscillating PWM modulators 2A, 2B in a driver circuit 3. The driver circuit 3 shown in FIG. 7 is a driver circuit for driving an output signal for a two-wire telephone line 4. The driver circuit 3 is an xDSL driver circuit, for example, particularly an ADSL driver circuit. The driver circuit 3 has a signal input 5 for receiving an input signal, particularly an analogue input signal. The analogue input signal is applied via a line 6 to a signal input 7A of the first PWM modulator 2A. In addition, the input signal is inverted by an inverter 8 and is supplied via a signal line 9 to a signal input 7B of the second PWM modulator 2B. The PWM modulators 2A, 2B are self-oscillating PWM modulators which output a pulse-width-modulated output signal via output signal lines 11A, 11B to an out-of-band filter 12 via a signal output 10A, 10B. Besides the signal input 7A, 7B and the signal output 10A, 10B, the PWM modulators 2A, 2B respectively have, in addition, a control input 13A, 13B which receives a synchronization control signal from the inventive synchronization circuit 1.

The inventive synchronization circuit 1, as is shown in FIG. 7, essentially comprises a focal-point phase detector (SPPD) 1A and a downstream loop filter 1B, which is preferably formed by at least one series-connected integrator. The synchronization circuit 1 preferably has a first signal input 14A for receiving the first pulse-width-modulated output signal from the first PWM modulator 2A and a second signal input 14B for receiving the second pulse-width-modulated output signal from the second self-oscillating PWM modulator 2B. In addition, the synchronization circuit 1 has a first output 15A for outputting a first synchronization control signal to the control input 13A of the first PWM modulator 2A via a control line 16A. Furthermore, the synchronization circuit 1 has a second output 15B for outputting a second synchronization control signal to the control input 13B of the second PWM modulator 2B via a control line 16B.

The out-of-band filter 12 is used to reconstruct the amplified analogue signal from the two pulse-width-modulated output signals from the PWM modulators 2A, 2B. In the case of the embodiment shown in FIG. 7, the out-of-band filter 12 in the driver circuit 3 is a fourth-order analogue filter which contains the two coils LA, LB of a common-mode choke and also two capacitor pairs C1A, C1B and C2A, C2B. In addition, the leakage inductances of the transformers 17A, 17B contribute to the filter response of the out-of-band filter 12. The primary coils of the transformers 17A, 17B are connected to one another by means of a terminating impedance $Z_T$. The secondary coils of the transformers 17A, 17B are coupled to one another by means of a terminating capacitor $C_T$. The transformers 17A, 17B are connected to a signal output 18A, 18B of the driver circuit 3. The signal output 18A, 18B of the driver circuit 7 preferably has a twisted-pair telephone line 4 connected to it.

Figure 8:
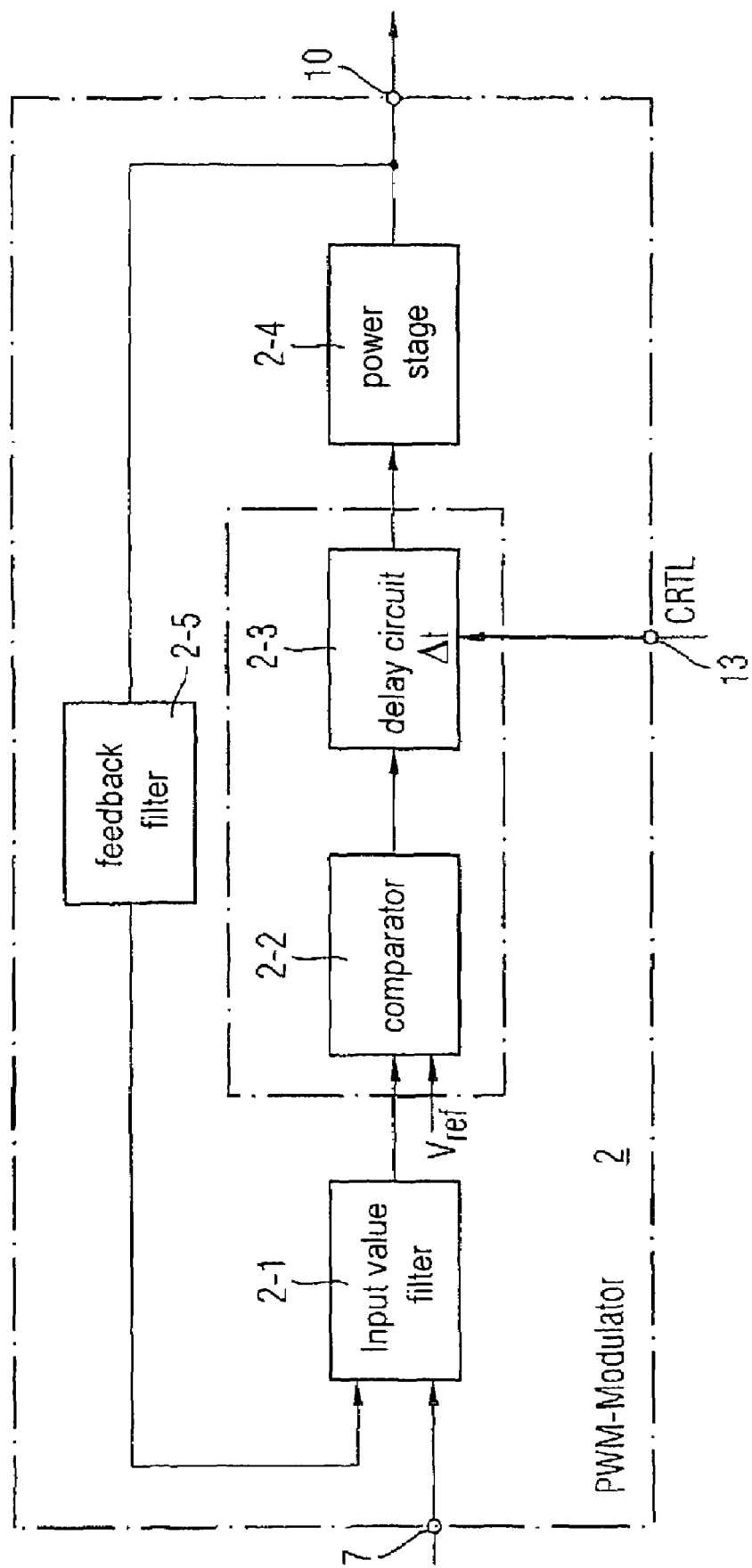
FIG. 8 is a block diagram of a PWM modulator which can be synchronized by a synchronization circuit based on the invention.

FIG. 8 shows a block diagram of a preferred embodiment of the PWM modulators 2A, 2B contained in the driver circuit 3. The PWM modulators 2A, 2B are respectively self-oscillating PWM modulators which operate at the same switching frequency. The two PWM modulators 2A, 2B operate approximately at the same frequency, with an error in the switching frequency being eliminated by the inventive synchronization circuit 1.

The PWM modulator 2 shown in FIG. 8 has a signal input 7 for receiving an analogue input signal. An input signal filter 2-1 filters a difference signal between the analogue input signal and a feedback signal. A downstream comparator 2-2 compares the filtered difference signal with a reference voltage to produce a comparator output signal and outputs said signal to a delay circuit 2-3. The delay circuit 2-3 delays the timing of the received comparator output signal on the basis of the synchronization control signal CRTL which is applied to a control input 13 of the PWM modulator 2. a power stage 2-4 amplifies the delayed comparator output signal and outputs it as a pulse-width-modulated output signal to a signal output 10 of the PWM modulator 2. In addition, the PWM modulator 2 contains a feedback filter 2-5 which filters the amplified comparator output signal and outputs it as a feedback signal to the input signal filter 2-1.

Figure 9:
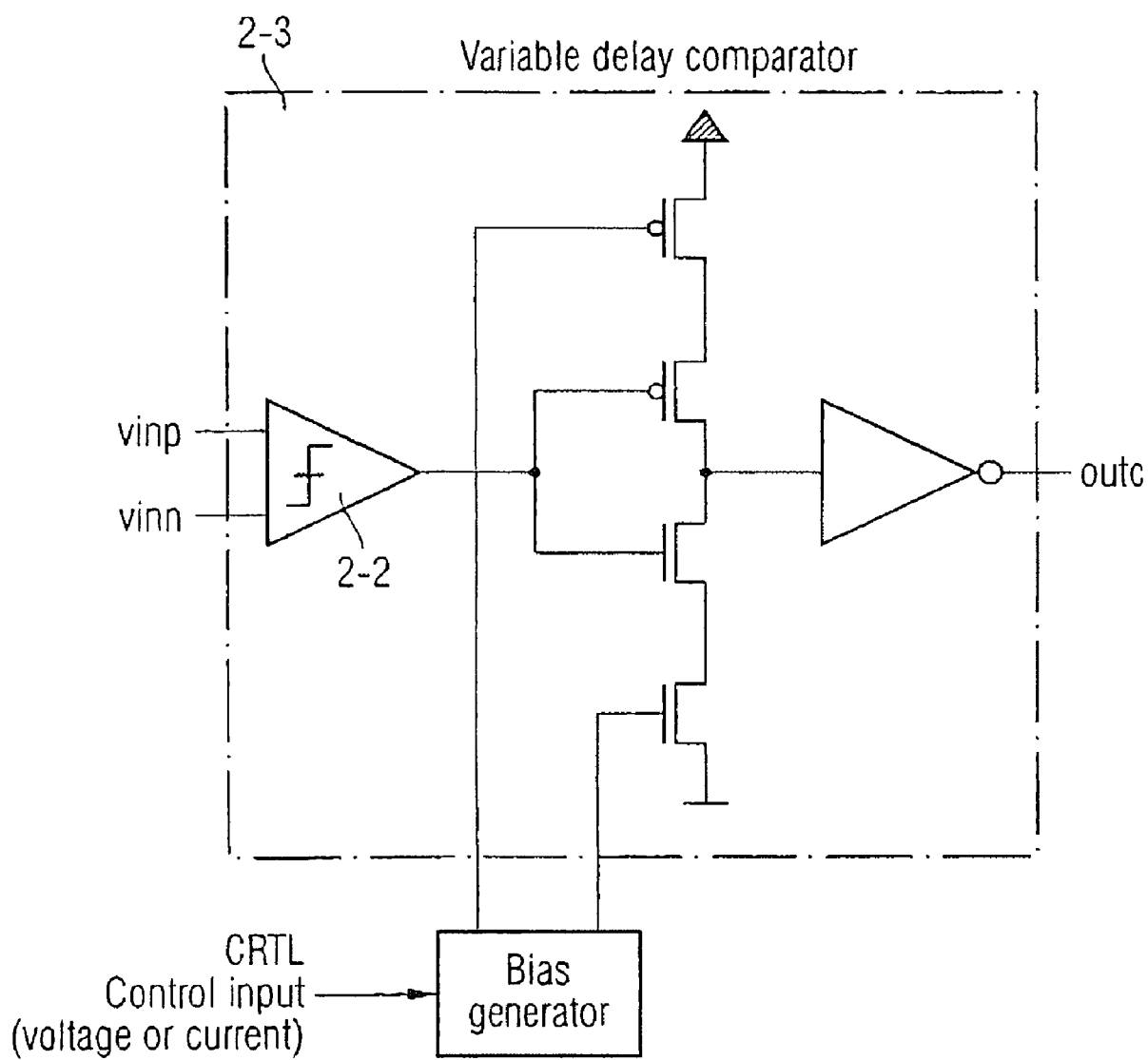
FIG. 9 is an exemplary embodiment of a comparator whose timing can be delayed in an exemplary embodiment of a PWM modulator which can be delayed by the inventive synchronization circuit.

FIG. 9 shows a preferred embodiment of a comparator 2-2 with an integrated delay circuit 2-3. An inverter with an adjustable maximum current is used as a component with a variable time delay for the signal. This controls the total delay for the self-oscillating PWM loop and hence the switching frequency for the PWM modulator. The scope of the time delay is set very accurately by an analogue input variable, for example a voltage or a current. In the case of the embodiment shown in FIG. 9, a bias generator is actuated by a voltage control signal delivered by the synchronization circuit 1 and actuates the gate connections of the MOS field-effect transistors whose timings are of complementary design relative to one another. These two MOS field transistors are respectively connected in series with a field-effect transistor in a CMOS stage which is provided between the output of the comparator 2-2 and the inverter.

The time delay for the digital inverter is set or trimmed downstream of the comparator 2-2. An advantage of the implementation shown in FIG. 9 is therefore that the time delay is controlled at an insensitive potential node in the circuit at which the signal amplitude can adopt only two different signal levels or signal values. If the tuning range is large then the time delay can be achieved using a plurality of inverters connected up to one another. In the case of a differential embodiment, an inverter with a differential amplifier is preferably used. A differential embodiment is particularly robust in the face of ambient noise.

Figure 10:
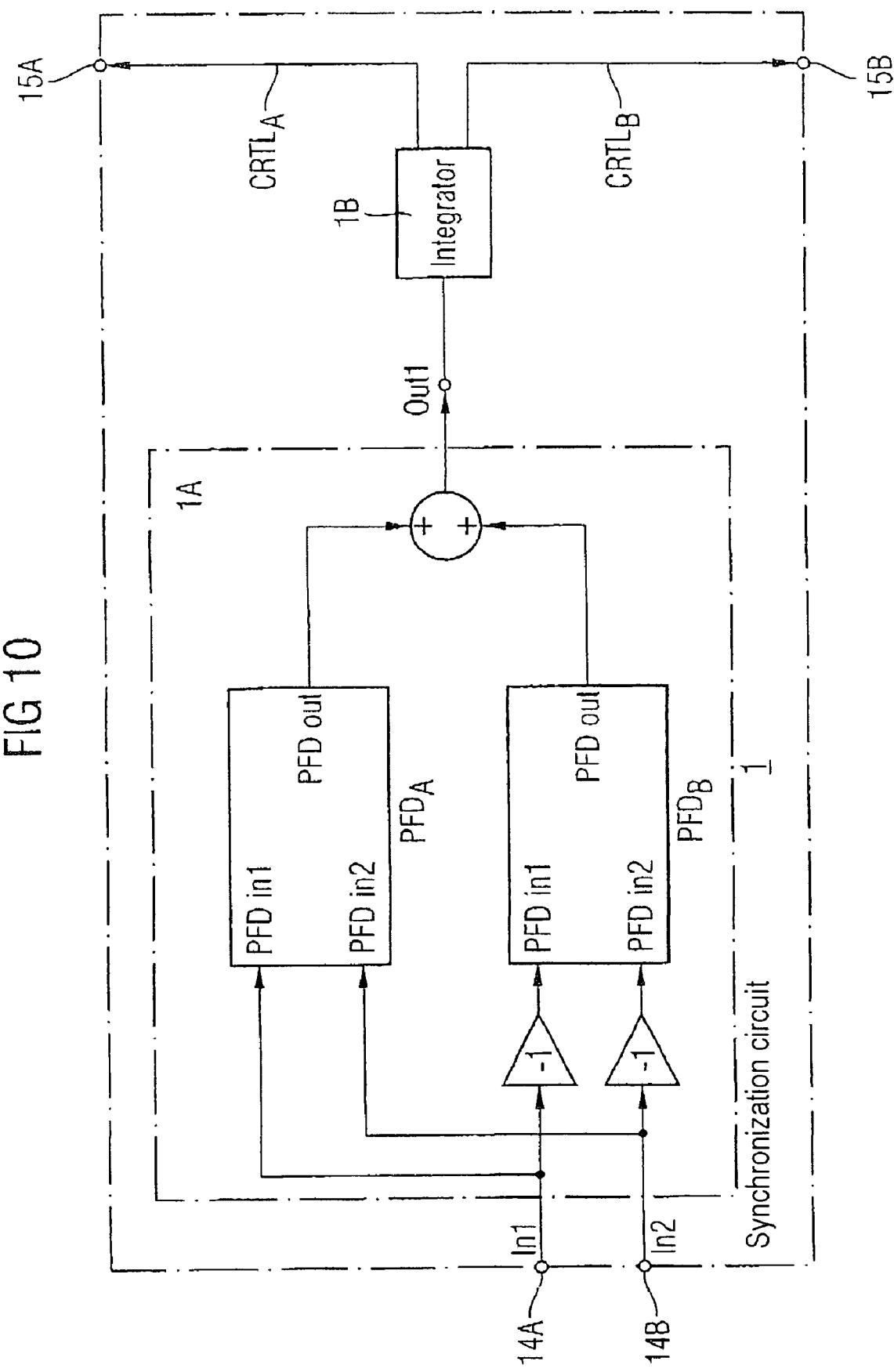
FIG. 10 is a block diagram of an exemplary embodiment of the inventive synchronization circuit for synchronizing two self-oscillating PWM modulators.

FIG. 10 shows a particularly preferred embodiment of the inventive synchronization circuit 1. The synchronization circuit 1 contains a focal-point phase detector 1A and a downstream analogue loop filter 1B which is preferably formed by at least one series-connected integrator. The focal-point phase detector 1A is preferably formed by two phase detectors PFD. In this case, the first phase detector $PFD_A$ is used to ascertain a phase difference between the rising signal edges of the two pulse-width-modulated output signals from the PWM modulators 2A, 2B which are applied to the signal inputs 14A, 14B. The second phase detector $PFD_B$ is provided for ascertaining a negative phase difference between the falling signal edges of the two pulse-width-modulated output signals. In addition, the focal-point phase detector 1A contains an adder which adds the phase differences ascertained by the phase detectors and outputs them to the downstream loop filter 1B. The at least one integrator contained in the loop filter integrates the added phase differences in order to produce synchronization control signals CRTLA, CRTLB for actuating the delay circuits 2-3 contained in the two self-oscillating PWM modulators 2A, 2B. The loop filter 1B is preferably of differential design.

The synchronization circuit 1 shown in FIG. 10 shifts the timings of the two pulse-width-modulated output signals from the PWM modulators 2A, 2B, which are applied to the signal input 14A, 14B of the synchronization circuit 1, relative to one another such that a difference signal between the two pulse-width-modulated output signals has no frequency components in a frequency range of the switching frequency for the self-oscillating PMW modulators 2A, 2B. The summed signal which is output by the adder produces a pulse train which approximates the average value zero if the focal-point phase detector 1A delivers output pulses which are of synchronous orientation relative to one another.

Figure 11:
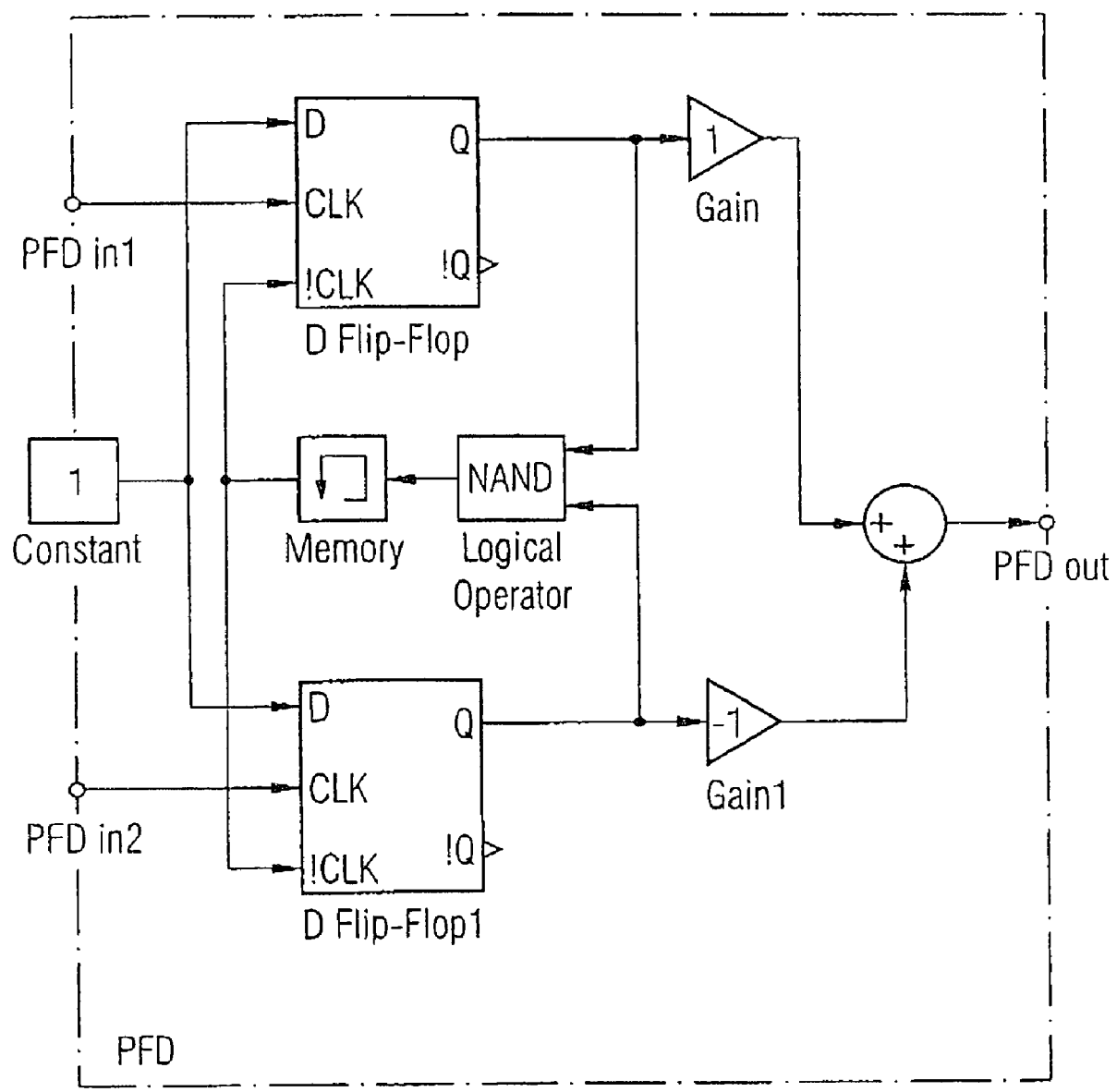
FIG. 11 is an exemplary embodiment of a phase detector of the inventive synchronization circuit.

FIG. 11 shows a particularly preferred embodiment of the phase detectors PFD contained in the focal-point phase detector 1A. The phase detector PFD contains two D-type flip-flops whose data input D receives a constant value and whose data outputs are output to an adder via amplifiers with a gain factor of 1 or −1 in order to produce a phase difference signal. The clock inputs of the two D-type flip-flops respectively receive the two pulse-width-modulated output signals or the inverted pulse-width-modulated output signals. The logic outputs of the D-type flip-flops are logically combined with one another by means of a NAND gate, the output of the NAND gate being connected to a buffer store. The output of the buffer store is connected to a reset or CLR connection of the D-type flip-flops.

FIG. 12 shows signal diagrams to explain the way in which the inventive synchronization circuit 1 works.

Figure 12A:
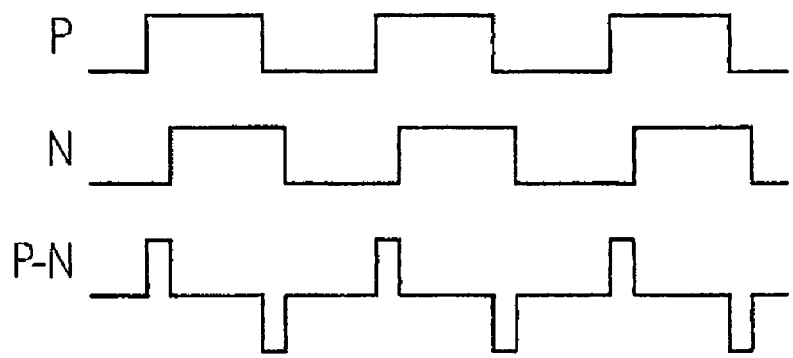
FIG. 12 is a signal diagrams to explain the way in which of the inventive synchronization circuit works.

FIG. 12A shows two pulse-width-modulated output signals P, N which are output by two unsynchronized PWM modulators based on the prior art. FIG. 12A also shows the difference signal for the two pulse-width-modulated signals. As FIG. 12A reveals, the difference signal receives signal components with the time period of the two PWM-modulated output signals P, N.

Figure 12B:
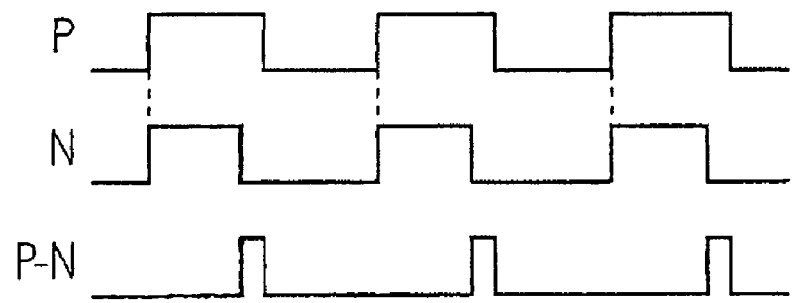

FIG. 12B shows synchronization or orientation with a standard phase detector, the rising signal edges of the two PWM signals being in sync with one another. However, the difference signal P-N likewise has signal components at the fundamental frequency or at the basis switching frequency of the two PWM modulators.

Figure 12C:
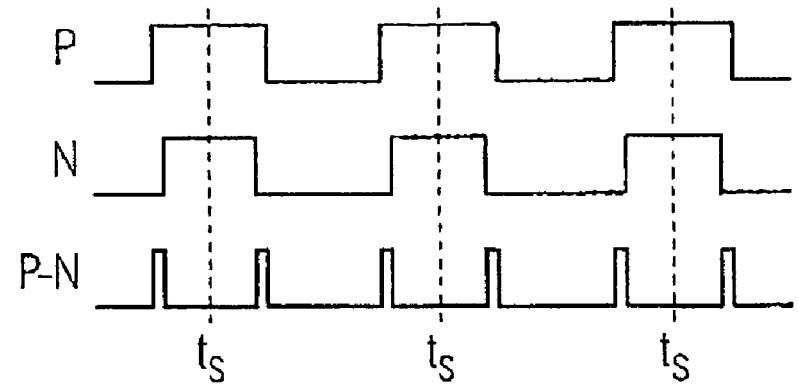

FIG. 12C shows two pulse-width-modulated output signals which are in sync with one another with the aid of the inventive synchronization circuit 1. The inventive synchronization circuit 1 shifts the two pulse-width-modulated output signals P, N from the two PWM modulators 2A, 2B such that the signal pulse centers are in sync with one another. As FIG. 12C reveals, the timings of the signal pulse centers of the PWM-modulated signals are in sync with one another, i.e. are at a sync time $t_S$. FIG. 12C shows the associated difference signal P-N. As FIG. 12C reveals, the difference signal has no signal components at the fundamental frequency or basis frequency of the PWM modulated signals P, N. In FIG. 12C, the difference signal P-N has six signal pulses, whereas the difference signal P-N in FIG. 12B has just three signal pulses. The PWM difference signal shown in FIG. 12C therefore has twice the number of pulses, i.e. the frequency of the occurring pulses is twice as high. Since the PWM difference signal shown in FIG. 12C has no spectral components occurring in the range of the switching frequency of the pulse width modulators 2A, 2B, it is possible to use an out-of-band filter (OOB) 12 with a smaller filter gradient or a lower filter order. This significantly reduces the circuit complexity for the driver circuit 3. The inventive synchronization circuit 1 can be used for efficiently synchronizing PWM modulators 2A, 2B which are relatively greatly mismatched to one another with little circuit complexity. This allows a significant reduction in the circuit complexity for the downstream out-of-band filter 12. The error between the two PWM modulators 2A, 2B is corrected in this case without any further nonlinear distortions arising.

What is claimed is:

1. A synchronization circuit for synchronizing at least two self-oscillating PWM modulators, each outputting a respective pulse-width-modulated output signal comprising signal pulses with signal pulse centers; said synchronizing circuit shifting the timings of said signal pulses relative to one another such that said signal pulse centers are in sync; wherein each of said self-oscillating PWM modulators comprises:
   a signal input for receiving an analogue input signal;
   an input signal filter producing a filtered difference signal by filtering a difference signal between said analogue input signal and a feedback signal;
   a comparator for generating a comparator output signal by comparing said filtered difference signal with a reference voltage;
   a delay circuit for generating a delayed comparator output signal by delaying said comparator output signal on the basis of a synchronization control signal;
   a power stage amplifying for generating an amplified comparator output signal by amplifying said delayed comparator output signal;
   a feedback filter for generating a feedback signal for said input signal filter by filtering said amplified comparator output signal; and
   a signal output outputting said amplified comparator output signal as said respective pulse-width-modulated output signals of the relevant of said PWM modulators.

2. The synchronization circuit of claim 1, comprising:
   a first input for receiving a first pulse-width-modulated output signal generated by a first of said self-oscillating PWM modulators;
   a second input for receiving a second pulse-width-modulated output signal generated by a second of said self-oscillating PWM modulators;
   a first output for outputting a first synchronization control signal for said delay circuit of said first self-oscillating PWM modulator; and
   a second output for outputting a second synchronization control signal for said delay circuit of said second self-oscillating PWM modulator.

3. The synchronization circuit of claim 1, comprising:
   a first phase detector for detecting a phase difference between rising signal edges in said pulse-width-modulated output signals;
   a second phase detector for detecting a negative phase difference between falling signal edges in said pulse-width-modulated output signals;
   an adder generating an addition signal by adding said phase differences detecting by said phase detectors; and
   an integrator generating said synchronization control signals for actuating said delay circuits of said self-oscillating PWM modulators by integrating said addition signal.

4. The synchronization circuit of claim 1, shifting said timings of said pulse-width-modulated output signals relative to one another such that a difference signal between said pulse-width-modulated output signals comprises no frequency components in a frequency range of a switching frequency of said self-oscillating PWM modulators.

5. The synchronization circuit of claim 2, wherein said analogue input signal for said second PWM modulator is the inverse of said analogue input signal for said first PWM modulator.

6. The synchronization circuit of claim 1, wherein said analogue input signal is an xDSL signal.

7. The synchronization circuit of claim 1, wherein said analogue input signal is an audio signal.

8. The synchronization circuit of claim 1, wherein said pulse-width-modulated output signals whose timings have been shifted relative to one another are filtered by a downstream OOB filter.

9. The synchronization circuit of claim 8, wherein said signal filtered by said OOB filter is output to a two-wire telephone line.

10. A method for synchronizing at least two self-oscillating pulse-width-modulated signals, comprising:
   for each of at least two self-oscillating pulse-width-modulated signals:
      receiving an analogue input signal, producing a filtered difference signal by filtering a difference signal between said analogue input signal and a feedback signal, generating a comparator output signal by comparing said filtered difference signal with a reference voltage, generating a delayed comparator output signal by delaying said comparator output signal on the basis of a synchronization control signal, generating an amplified comparator output signal by amplifying said delayed comparator output signal.

generating a feedback signal for producing said filtered difference signal by filtering said amplified comparator output signal, and outputting said amplified comparator output signal as one of said at least two pulse-width-modulated signals; and shifting timings of signal pulses of said at least two pulse-width-modulated signals relative to one another such that signal pulse centers of said signal pulses are in sync with one another.

\* \* \* \* \*